United States Patent [19]

Harris

[11] Patent Number: 4,953,058
[45] Date of Patent: Aug. 28, 1990

[54] MODULAR SEGMENT ADAPTED TO PROVIDE A PASSIVELY COOLED HOUSING FOR HEAT GENERATING ELECTRONIC MODULES

[75] Inventor: Michael P. Harris, San Diego, Calif.

[73] Assignee: General Dynamics Corporation, Space Systems Div., San Diego, Calif.

[21] Appl. No.: 401,719

[22] Filed: Sep. 1, 1989

[51] Int. Cl.⁵ .............................................. H05K 7/20
[52] U.S. Cl. .................................. 361/383; 165/80.3; 361/394; 361/396; 361/398; 361/399
[58] Field of Search ...................... 165/80.3, 104.33; 174/15.1, 16.1, 16.3; 361/383–389, 394, 395, 398, 396, 399, 413, 415

[56] References Cited

U.S. PATENT DOCUMENTS

| | | | |
|---|---|---|---|
| 3,601,661 | 8/1971 | Kleinhample | 361/389 |
| 4,756,081 | 7/1988 | Penn | 361/387 |
| 4,777,561 | 10/1988 | Murphy et al. | 361/386 |
| 4,858,070 | 8/1989 | Baron et al. | 361/384 |

*Primary Examiner*—Gregory D. Thompson
*Attorney, Agent, or Firm*—John R. Duncan; Frank D. Gilliam

[57] ABSTRACT

A modular segment that is adapted to receive heat generating electronic assemblies therewithin. The modular segments may be joined together to form a housing and the electronic assemblies are electrically interconnected through a hollow channel provided in the joined modular segments. The segments are configured with fins and ribs that form air channels on all vertical outer surfaces of the segments to promote cooling by convective air flow through the channels and between the segments. Segments may be added to form a housing with expanded capacity.

26 Claims, 3 Drawing Sheets

MODULAR SEGMENT ADAPTED TO PROVIDE A PASSIVELY COOLED HOUSING FOR HEAT GENERATING ELECTRONIC MODULES

FIELD OF THE INVENTION

This invention relates to improvements in passively cooling heat generating electronic apparatus and more particularly, but not by way of limitation, to a modular segment adapted to cooperate with similar segments to provide a passively cooled housing for electronic assemblies that may cool by convection or conduction and which seals the electronic assemblies contained therewithin from contact with dust, moisture, debris and other deleterious substances.

BACKGROUND OF THE INVENTION

In the past it has been recognized that it is desirable to provide cooling for heat generating electronic assemblies to enhance the performance and service life of such assemblies. Generally, this cooling has been provided in two ways. The first is by providing physical arrangements that promote the passive cooling of the electronic assembly. The second is by providing forced air cooling of the assemblies so as to maintain the temperature of the electronic assemblies below their maximum operating temperature.

The heat problem arises because it is desired to provide an electrical system which occupies as minimum a volume as possible and when electrical circuitry is placed into a housing which is close quartered so as to utilize a small volume, a heat problem arises. Thus, it is desired to provide for efficient dissipation of the heat. In addition, in complex electronic circuits, such as computers, it is also desired to make the system expandable. Also, it is desired to provide a system which is able to withstand high shock and vibrations for rugged commercial or government applications.

Also, electronic systems often use a plurality of circuit modules each of which performs a function, which modules are connected to form a system. Since the function performed by a particular module is often a standardized function, used throughout a particular industry, many manufacturers of electronic equipment sell "standard" modules for performing these standard functions.

One prior art approach for housing of such electronic equipment is to manufacture a sheet metal box designed specifically for each customer configuration and permanently wire the electronic modules together to provide power, ground and data signal paths. This approach involves substantial cost because a large number of different box configurations must be kept in stock to accommodate various customer configurations. Accordingly, a need has existed to provide an electronic circuit chassis which can house electronic circuit modules in various configurations without requiring a box of any type, that is also expandable according to the particular application, and which can provide passive cooling for the electronic circuit modules in the absence of forced air for convective cooling or a cold contiguous plate for conductive cooling.

Illustrative of an arrangement for passive cooling of electronic circuitry is U.S. Pat. No. 3,940,665 dated Feb. 24, 1976 entitled CHASSIS DEVICE HAVING VENTED BASE AND RADIATION MEMBER FOR SUPPORTING HEAT SOURCES. The '665 patent discloses a heat dissipation device comprising a chassis base having an air space therebelow and an H-shaped heat radiation member mounted vertically on the upper surface of the chassis base. Spaced parallel bridging portions close the openings of the H-shaped member. Electronic elements mounted on the cross piece of the H-shaped member and the bridging portions are connectively cooled by air flowing into the base and upwardly through openings that communicate with the chambers formed between the cross piece of the H-shaped member and the bridging portions.

U.S. Pat. Nos. 3,541,433 and 3,701,928 by A. R. Davis and directed to CURRENT SUPPLY APPARATUSES WITH AN INDUCTIVE WINDING AND HEAT SINK FOR SOLID STATE DEVICES and FRAMEWORK FOR SUPPORTING AIR COOLED ELECTRICAL AND ELECTRONIC EQUIPMENT disclose an alternating current controller that is adapted to be passively cooled. The alternating current controller includes a solid state controlled device section and two heat sinks in the form of two U-shaped aluminum body portions that extend vertically from the controlled device section. Each U-shaped portion is provided with vertical fins that extend perpendicularly from the outer surface of the U-shaped body portions to provide a large cooling surface and to form vertically extending channels for the passage of cooling air.

A framework for supporting these current supply apparatuses is provided by a plurality of vertical rectangular open frames interconnected at the top and bottom by tie beams and intermediately by a plurality of vertically spaced shelves. The shelves have horizontal cross members mounted on the frames and support beams mounted on the cross members in electrically isolated relation therewith. Current carrying cables in the frame, cross members and beams supply electrical current to the current control units of the '433 patent that are mounted on the connecting support beams and electrically connected thereto.

U.S. Pat. No. 4,503,484 issued on Oct. 28, 1983 for CHASSIS FOR ELECTRONIC CIRCUITRY discloses a modular chassis for electronic circuit modules in which a support frame is fabricated from two flat side panels spaced apart by four rods. The rods may be of variable length to accommodate various chassis widths. Each electronic circuit module has four slots which engage the four rods so that, when the modules are placed in the frame and the rods are in place, the modules are rigidly locked together to form a unit. Power, ground and data signals are conveyed between the modules by an internal cable which connects the modules in parallel so that only connections with external circuitry need be made through connectors in the side panels. A cover for the chassis is provided with a plurality of slots to promote cooling by natural or forced airflow of the modules.

U.S Pat. Nos. 3,648,113; 4,399,113; and 4,291,364 disclose modular electronic systems which include a plurality of electronic circuit modules that are arranged within a cabinet that is provided with a variety of apertures whereby forced airflow is introduced into the cabinet and provides desired cooling of the electronic modules before exiting in a predetermined manner.

U.S. Pat. Nos. 4,158,875; 4,386,651; and 4,148,534 disclose air cooling equipment for use in electronic systems of the type having a plurality of printed circuit wiring boards with a plurality of heat generating electronic components mounted thereon. The air cooling equipment disclosed in these patents utilize ducting that is disposed exteriorly of the frame supporting the printed circuit boards and which introduces a forced airflow into the frame through various apertures to establish multiple cooling paths for such airflow to promote cooling of the heat generating electronic components.

U.S. Pat. Nos. 3,723,823 and 3,838,777 illustrate various frames and guides for holding printed circuit boards that carry heat generating electronic components. The '823 patent provides proper alignment of a printed circuit board with an associated electrical connector after insertion of the board into the connector.

All of the aforementioned patents which disclose the state of the prior art do not teach modular segments that are adapted to be assembled into a housing for heat generating electronic modules, which housing provides passive cooling for the modules, expansion of the housing as desired, as well as providing means for electrical interconnection of the electronic modules while avoiding an undesired buildup of tolerances in assembly. Neither do such patents teach modular segments being joined together into a housing that can function satisfactorily in the hostile environment of a tank or other combat vehicle. In such environments no means of normal cooling such as forced air, cold conductive plate, or fluids are available. Further the housing may be immersed in water and be exposed to high pressure hosedowns. The housing and contained electronic modules must function in severe shock and vibration and must resist becoming a secondary projectile if the vehicle is hit by a projectile.

SUMMARY OF THE INVENTION

Briefly stated, the present invention comprises a modular segment adapted to be assembled into a passively cooled housing for heat generating electronic assemblies. Each modular segment comprises a vertically extending hollow box shaped portion, the side walls of the box shaped are configured to be coupled together into a housing that provides vertically extending air channels that promote convective cooling. Each modular segment is provided with a base portion that cooperates in the coupling of adjacent segments and which provides a horizontally extending channel that communicates with the interior of the hollow box shaped portion. The modular segments are suitably secured together in the number required and are provided with closures to protect electronic assemblies positioned therewithin.

Electronic assemblies are positioned within the modular segments in aligned positions and are electrically connected to suitable electrical cable means which extend through horizontal channel in the modular segments to provide an electrical interconnection means for the electronic assemblies.

BRIEF DESCRIPTION OF THE DRAWINGS

While the invention may be constructed in various ways and embodiments, with a number of possible modifications, other advantages and aspects of the invention will become apparent by reference to the following detailed specification and drawings of a specific embodiment thereof, wherein.

DETAILED DESCRIPTION OF THE DRAWINGS

Figure 1:
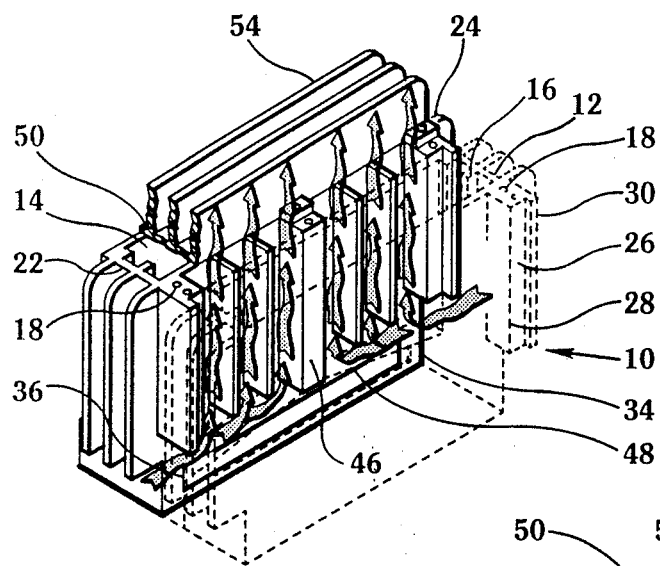
FIG. 1 is a perspective, having a portion partially cut away, that illustrates a modular segment constructed in accordance with the present invention and particularly demonstrating the air flow for convective cooling.
Figure 2:
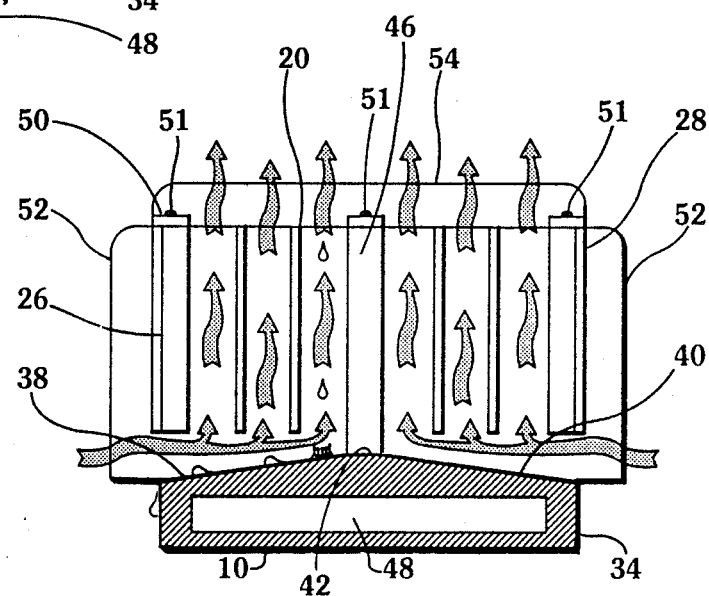
FIG. 2 is an end view of the modular segment shown in FIG. 1.

Referring now to the drawings in detail and in particular to FIGS. 1-2, the reference character 10 designates a modular segment constructed in accordance with the present invention. The modular segment 10 of the present invention comprises a vertically extending hollow box beam portion 12 that forms a vertically extending hollow channel 14. The interior of the box shaped portion is provided with plurality of opposed vertically extending ribs 16 that are perpendicularly disposed to the side walls of the hollow box shaped portion 12 for a purpose to be hereinafter described more fully.

The box shaped portion 12 is formed by three sidewalls 18, 20 and 22 which form a U-shaped section that is bridged at one end by smooth sidewall 24. The sidewall 20 of the box shaped portion 12 that opposes the smooth sidewall 24 is provided at its outer edges with vertically extending perpendicularly disposed ribs 26 and 28 that in turn have vertically extending flanges 30 and 32 that extend from the outer extremities of the ribs 26 and 28.

The modular segment 10 is also provided with a base portion 34 that has a spacer section 36 that extends longitudinally adjacent to the smooth sidewall 24 of the hollow box shaped portion 12 a predetermined distance that preferably is equal to the distance the ribs 26 and 28 extend from the sidewall 20.

The spacer section 36 is also provided with upwardly and inwardly sloping shoulders 38 and 40 to enhance shedding impinging water and debris that terminate in a central flattened shoulder 42 that preferably receives the lower surface 44 of a central rib 46 that extends outwardly from the sidewall 20 the same distance as the two ribs 26 and 28. As seen in FIG. 1 where the ribs 26 and 28 and the central rib 46 of one modular segment are shown positioned against the smooth sidewall 24 of another modular segment 10, with the remainder of one modular segment 10 being omitted for purposes of illustration, the smooth sidewall 20 is positioned against the central rib 46 and between the opposing ribs 26 and 28 of an adjacent modular segment 10. A modular segment 10 is dimensioned so that it perpendicularly extending spacer portion 36 contacts the base portion 34 of an adjacent segment below the sidewall 20, the central rib 46 contacts the smooth sidewall 20 and the shoulder 42 of base extending portions 36 and the edges of the smooth sidewall 20 fit snugly against the ribs 26 and 20 and between the extending flanges 30 and 32.

The base portion 34 is further provided with a longitudinally extending channel 48 which, when two adjacent modular segments are aligned and coupled together, provide an extended channel 48 that extends longitudinally through a series of such segments 10 for a purpose to set forth hereinafter in greater detail. It is to be understood that the longitudinally extending channel 48 communicates with the horizontal extending channel 14 of the hollow box shaped upper portion 12, as seen most clearly in FIG. 7.

Two adjacent modular segments 10 may be coupled together as in any suitable manner. If the segments 10 are formed of metal the segments 10 may be dip brazed to join them together. If the segments 10 are formed of a plastic material then they could be adhesively bonded together. A suitable cap member 50 is adapted to be secured to each modular segment 10 as by screws or the like 51 that extend into the upper surfaces of ribs 26 and 28.

The cap member 50 closes the box shaped upper portion 12 of a segment 10 to sealingly close it to protect an electronic assembly positioned therewithin from an unfavorable environment.

To promote cooling of electronic assemblies contained within a modular segment 10, the sidewalls 18, 20, and 22 are each provided with a plurality of vertically extending perpendicularly disposed fins 52. As seen most clearly in FIG. 2, the ribs 26 and 28 extend downwardly only a predetermined distance and the lower ends thereof are spaced from the shoulders 38 and 40 of the extending spacer section 36. Thus, ribs 26 and 28, and central rib 46 cooperate with the fins 52 to form vertically extending channels that promote the upward flow of air between adjacent segments 10 to assist in the convective cooling of the segments 10 as seen most clearly in FIG. 1.

Similarly, the fins 52 disposed on the opposing sidewalls 18 and 22 form air channels that provide additional cooling of the segment 10 by heat dissipation and convective cooling. The cap member 50 is also provided with plurality of vertically extending cooling fins 54 that act as a heat sink for further cooling by heat dissipation.

Figure 3:
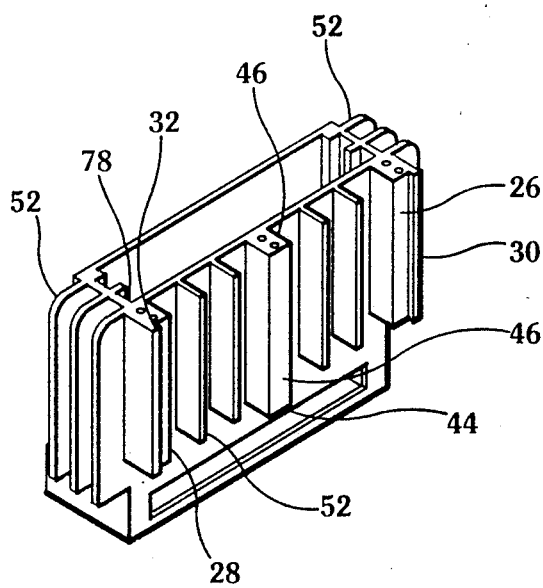
FIG. 3 is a perspective of one side of the modular segment.
Figure 4:
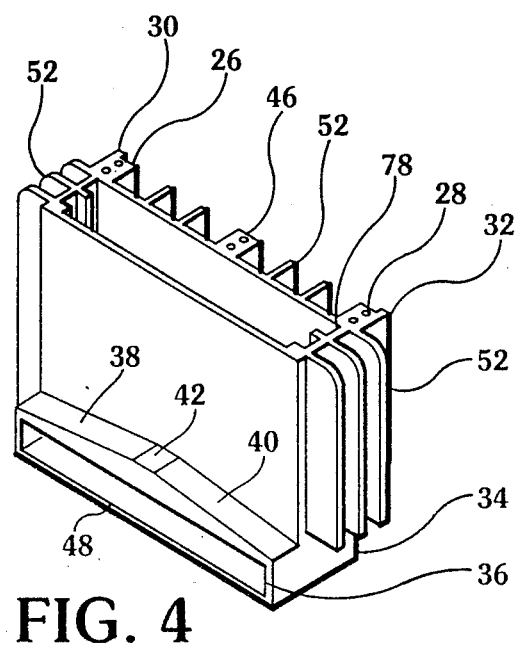
FIG. 4 is a perspective that presents another side of the modular segment.
Figure 5:
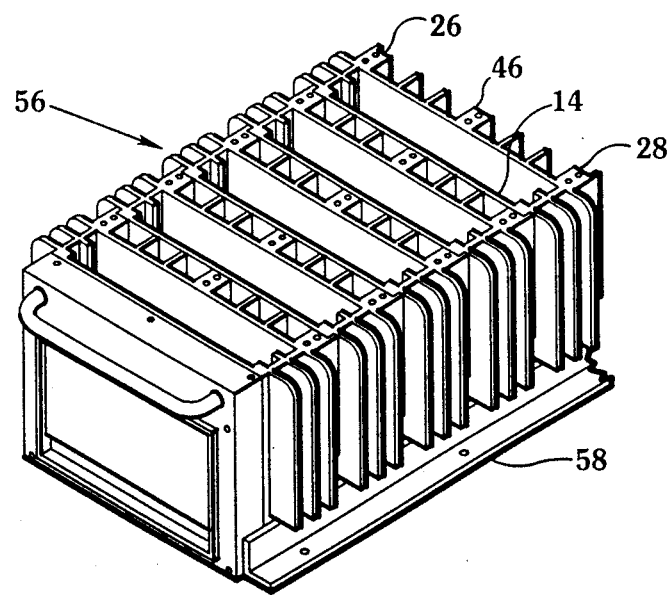
FIG. 5 is a perspective illustrating the modular segments coupled together to provide a passively cooled housing for electronic equipment.

As shown in FIG. 5, the modular segments 10 may be coupled together as shown in FIGS. 3 and 4 to provide a unitary housing generally designated 56 that is provided with a plurality of serially arranged hollow chambers that communicate with a longitudinally extending channel. The housing 56 may be secured to a suitable surface by longitudinally extending flanges 58.

As illustrated, the housing 56 comprised of modular segments 10 is particularly configured to promote passive cooling of heat generating electronic assemblies positioned therewith. However, it would be within the scope of the invention, if the housing 56 were to be secured to a cold surface by the flanges 58, to omit the fins 52 and 54 and provide passive cooling of the housing 56 primarily by conduction.

Figure 6:
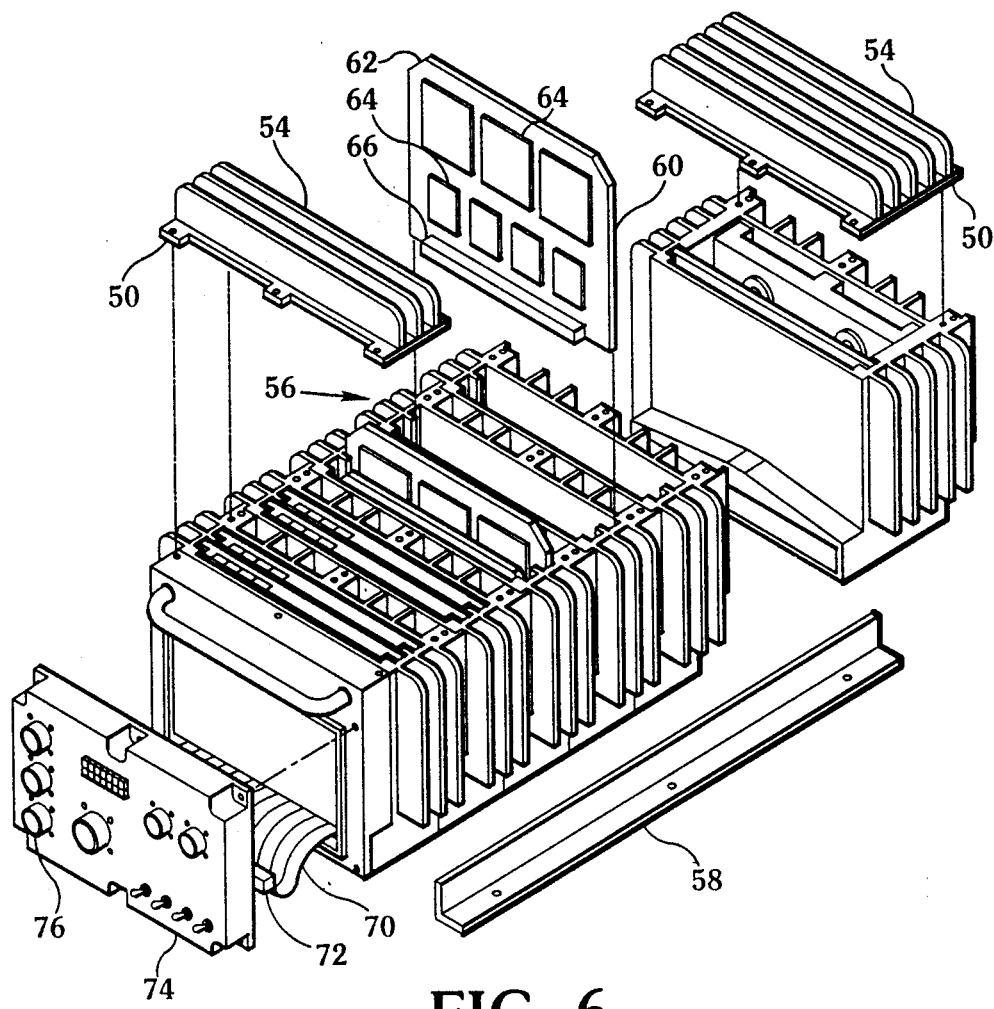
FIG. 6 is a partially exploded perspective of the housing of FIG. 5 that illustrates how electronic assemblies may be inserted into the housing and the housing further assembled into a complete piece of electronic equipment.

Referring now to FIG. 6 through FIG. 9 it will be seen how the modular segment 10 is particularly adapted to provide a passively cooled housing 56 for electronic assemblies to be contained therewithin. As seen in FIG. 6, electronic assemblies 60 to be positioned within the housing 56 comprise printed circuit boards 62 upon which are mounted heat generating electronic components 64 that have a maximum operating temperature. The printed circuit boards 62 have secured thereto suitable multi-pin connectors 66.

Figure 8:
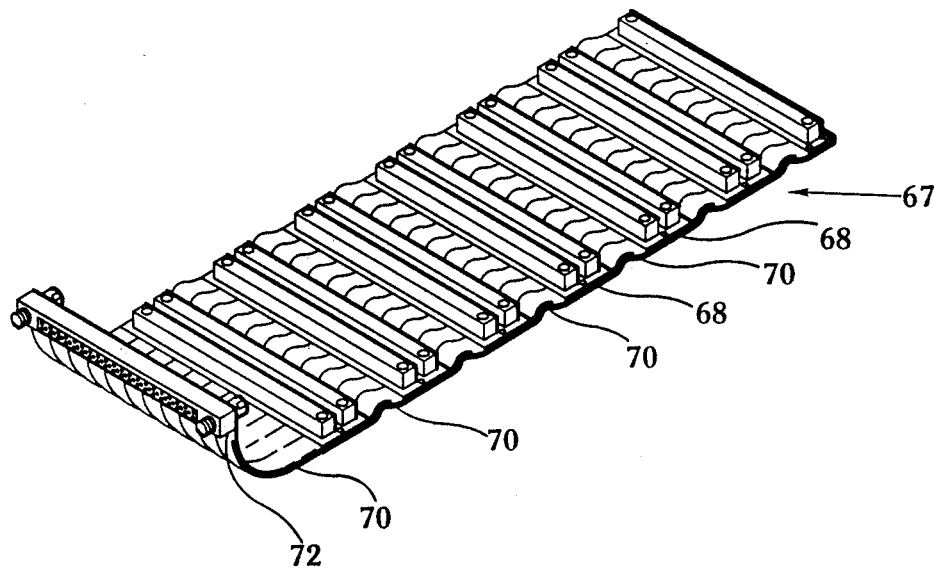
FIG. 8 is a perspective of the electrical connector means used to advantage to electrically couple the electronic assemblies contained within the housing of FIG. 6.
Figure 9:
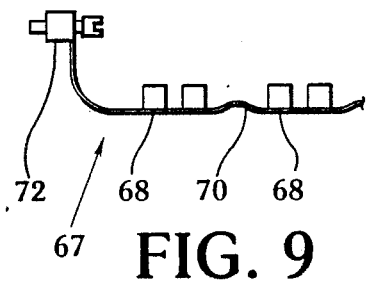
FIG. 9 is a partial detail side view of the electrical connector means shown in FIG. 8.

In FIG. 8 a segmented backplane 67 is illustrated. Suitable rigid connector sections 68 are provided that are adapted to be electrically coupled to the connectors 66. A flexible multiple conductor connection means 70 is provided to electrically couple the rigid connector sections 68 to provide data, power, and ground signals to the associated electronic assemblies. A suitable IN/OUT connector section 72 is electrically coupled to the flexible cable means 70 and connected, as seen in FIG. 9, to a suitable front panel 74 that is provided with suitable switches and controls 76 as may be required.

Figure 7:
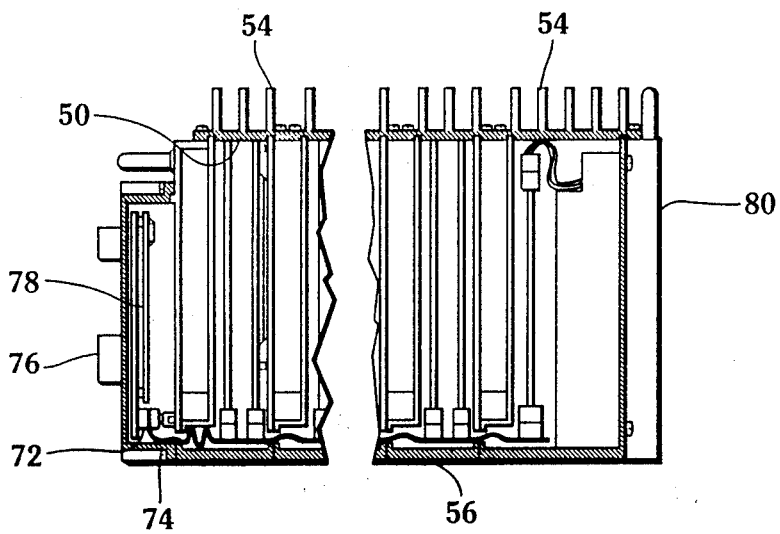
FIG. 7 is a partial cross section of FIG. 6 that illustrates the electrical interconnection scheme for the electronic assemblies positioned within the housing of FIG. 6.

The interior ribs 16 described earlier, and formed on the interior of sidewalls 18 and 22 provide two adjacent slots 78 in each sidewall 18 and 22 for the purpose of slidingly receiving electronic modules as in FIG. 6. The electronic modules may be held in place by any suitable arrangement, such as wedge clamps (not shown). Referring now to FIGS. 6 and 7 it will be seen that, in operation, the backplane 67, including sections 68 and flexible cable means, is positioned within the extended channel 48 provided by aligned segments 10. A rigid section 68 is positioned within the channel section 48 of each segment 10 and electronic modules 60 are slid into slots within the box shaped upper portion 12 of each segment 10 and electrically interconnected into the rigid sections 68. Since the flexible cable means 70 is allowed to flex and permit the segments 10 to be securely coupled together to form a unitary housing 56. Since the modular segments 10 are securely coupled together to expand the housing 56 as required, the flexible cable means 70 precludes a build up of tolerances as the housing 56 is expanded by the addition of further segments 10. Each module 60 may be considered to contain active devices which generate heat. Each module 60 is held in intimate contact with interior surfaces of the module 10 to promote the transfer of heat from the module 60 to the modular segment 10.

As seen in FIG. 7, the electronic modules 60 may be interconnected to provide data processing section that is coupled through connector 72 to a suitable I/F adapter 78 secured to the front panel 74. A suitable power supply 80 is electrically and mechanically coupled to the flexible cable means 70 and the housing 56 to provide an operative piece of electronic equipment.

While there have been shown and described a particular arrangement of a modular segment particularly adapted to be employed in a housing for passive cooling of electronic assemblies contained therewithin constructed in accordance with a preferred embodiment of the present invention for the purpose of teaching the manufacture and use of the invention by a person of ordering skill in the art, it will be appreciated that the invention is not limited thereto. Accordingly, any modifications, variations or equivalent arrangements within the scope of the attached claims should be considered to be within the scope of the invention.

What is claimed is:

1. A modular segment adapted to provide a passively cooled housing for a heat generating electronic assembly and comprising:

a generally rectangular vertically extending hollow box beam shaped portion that provides a vertically extending hollow channel;

the box beam portion including three vertically extending sidewalls that form a U-shaped section that is closed by a smooth sidewall, the smooth sidewall being adapted to interconnect with a cooperating modular segment;

a longitudinally extending base portion that includes a longitudinally extending hollow channel that communicates with the vertical extending hollow channel of the box beam portion;

the base portion having a spacer section that extends longitudinally from the lower portion of the smooth sidewall a predetermined distance; and two spaced vertically extending rib members extending from the sidewall of the U-shaped section that opposes the smooth sidewall, whereby the smooth sidewall may be positioned against the vertically extending ribs of another modular segment to provide a housing for an electronic assembly so that vertically extending electronic portions of the electronic assembly may extend upwardly into the vertical extending hollow channel of a box beam portion with such electronic portions being interconnected through the longitudinal extending hollow channel.

2. The modular segment of claim 1 wherein the modular segment is adapted to be removably secured to a cold surface whereby the modular segment provides passive cooling by conduction for an electronic assembly housed therein.

3. The modular segment of claim 1 wherein at least one of the sidewalls of the U-shaped section of the box beam portion is provided with vertically extending fins whereby the modular segment provides passive cooling by convection for an electronic assembly housed therein.

4. The modular segment of claim 1 wherein each of the sidewalls of the U-shaped section of the box beam portion is provided with a plurality of vertically extending rib members whereby the modular segment provides passive cooling by convection for an electronic assembly housed therein.

5. The modular segment of claim 4 wherein each of the vertically extending rib members that extend from the U-shaped section of the box beam portion further includes an edge member so that when the smooth wall section of a box beam portion is positioned against the rib members of a similarly shaped modular segment the edge members extend beyond the vertical outer extremities of the smooth side wall to sealingly engage with said similarly shaped module segment.

6. The modular segment of claim 4 wherein each of the vertically extending rib members that extend from the U-shaped section of the box beam portion extend vertically a predetermined distance so that when a first modular segment is positioned against a second modular segment at least one opening is provided between the spacer section and an adjacent rib member whereby when a first modular segment is positioned against a second modular segment to provide a passively cooled housing for an electronic assembly contained therein air may be permitted to flow through said opening and upwardly in the cavity provided by a spaced apart smooth sidewall and a sidewall of the U-shaped section of such modular segments.

7. The modular segment of claim 6 wherein a third rib member extends from the sidewall of the U-shaped portion intermediate of the two spaced apart rib members.

8. The modular segment of claim 7 wherein the third rib member extends downwardly into contact with the spacer section of the base portion that extends longitudinally from the lower portion of the smooth side wall so as to provide two vertically extending channels that provide channels for air to flow from outside of two contiguous modular segments through an opening provided between the lower portion of each rib member and a spacer section and upwardly to provide passive air cooling for electronic assemblies contained within a box beam portion of a modular segment.

9. The modular segment of claim 7 wherein the spacer section of the base portion is provided with shoulders on its upper portion that slope upwardly toward the contact of the spacer section with the third rib member to promote convection cooling of the modular segment.

10. The modular segment of claim 1 wherein the upper top surface of the hollow box beam portion is planar to permit closure of the hollow box portion to sealingly enclose an, electronic assembly within the hollow box beam portion and the vertically extending hollow channel or the box beam portion is configured to define at least two opposing vertical extending slots that are adapted to slidingly receive a vertically extending electronic portion of the electronic assembly.

11. The modular segment of claim 7 wherein vertically and outwardly extending fin members extend from a sidewall of the box beam portion and are spaced from the third rib member that also extends outwardly from said sidewall.

12. The modular segment of claim 1 wherein said modular segment forms a housing, said segment has the smooth sidewall of the box beam portion positioned against their members of a second modular segment and a cap member that is removably secured to the top surfaces of each modular segment to secure such segments together and to close the vertical extending hollow channel of the box beam shaped portion of each modular segment whereby the vertical extending hollow channels of the box beam portions provide a housing for electronic assemblies that are positioned therewith and the longitudinal hollow channel which extends through the aligned base portions of the modular segments provide electrical interconnection between such electronic assemblies.

13. The modular segment of claim 12 wherein each modular segment is provided with a plurality of spaced vertically extending fin members on predetermined external surfaces.

14. The modular segment of claim 13 wherein the cap member is provided with at least one vertically extending fin on its upper surface whereby such fin members on the modular segments and the cap member promote convective cooling of an electronic assembly positioned within the housing.

15. A passively cooled housing for an electronic assembly including a plurality of heat generating electronic components that are positioned on vertically extending printed circuit boards that are removably coupled to spaced apart connector sections that are interconnected by flexible cable sections, said housing comprising:

a plurality of modular segments that serially positioned in a longitudinally extending contiguous arrangement;

each modular segment including a vertically extending hollow box portion that provides a vertically extending hollow channel, the box portion including three vertically extending sidewalls that form a U-shaped portion that is closed by a smooth sidewall, a longitudinally extending base portion that is provided with a longitudinally extending hollow channel that also communicates with the vertically extending channel of the box portion, and two vertically extending spaced apart rib members that extend outwardly from the sidewall of the box portion that opposes the smooth sidewall;

each modular segment being positioned with respect to an adjacent modular segment so that the smooth wall of the box portion is positioned against he rib members of an adjacent modular segment abuts the lower portion of the smooth sidewall of the box beam portion of a modular segment whereby vertically extending printed circuit boards carrying the heat generating electronic components may be positioned within the vertical hollow channels of the box beam portions of each of the modular segments and such circuit boards may be interconnected through the flexible cable sections that extend through the aligned longitudinally extending channels provided in the base portions of the modular segments.

16. A passively cooled housing for an electronic assembly as defined in claim 15 wherein the boards are in physical contact with surfaces of a modular segment to promote cooling.

17. A passively cooled housing for an electronic assembly as defined in claim 16 wherein each cap member covers the vertical hollow channel within the box beam portion and is secured to the box beam portion of one modular segment.

18. A passively cooled housing for an electronic assembly as defined in claim 17 wherein each modular segment and each cap member is provided with vertically extending fin members to promote convective cooling of the housing.

19. A passively cooled housing for an electronic assembly as defined in claim 18 wherein the rib members of each modular segment cooperate with the smooth sidewall of an adjacent modular segment to provide an air path for the upward flow of air between two contiguous modular segments.

20. A passively cooled housing for an electronic assembly as defined in claim 19 wherein a control panel is removably secured to a modular segment at one end of a contiguous arrangement of segments and is electrically connected to the interconnected flexible cable sections.

21. A passively cooled housing for an electronic assembly as defined in claim 20 wherein a power supply is removably secured to the modular segment at the end of the segment arrangement opposing the control panel and is electrically connected to the interconnected flexible cable sections.

22. A passively cooled housing for an electronic assembly which includes a plurality of vertically extending heat generating electronic modules that are electrically interconnecting by flexible cable section means, said housing comprising:

a plurality of modular segments that are adapted to be releasably secured together in a longitudinally extending arrangement, each modular segment being folded with a vertically extending hollow channel that communicates with a horizontally extending hollow channel;

each modular segment being provided with a spacer section and rib members that cooperate when adjacent modular segments are secured together to provide a vertically extending air path between adjacent modular segments;

means securing adjacent modular segments together to form said housing, whereby a respective heat generating electronic module extends upwardly into the vertical extending hollow channel of respective modular segment and the flexible cable section means extends longitudinally through respective aligned horizontally extending hollow channels of the modular segments.

23. A passively cooled housing for an electronic assembly as defined in claim 22 which further includes means to secure the housing to a cold surface so that the housing may be cooled by conduction.

24. A passively cooled hosing for an electronic assembly as defined in claim 22 wherein each modular segment is provided with a plurality of fins to promote cooling of the housing by convection.

25. A passively cooled housing for an electronic assembly as defined in claim 22 wherein the walls of the vertically extending hollow channel within each modular segment is configured to define at least one pair of opposed vertically extending slots therein which are adapted to securely receive a vertically extending electronic module.

26. A passively cooled housing for an electronic assembly as defined in claim 22 wherein a modular segment at one end of the longitudinally extending arrangement is mechanically and electrically interconnected to a control panel for the electronic assembly and a modular segment at the other end of the arrangement is mechanically and electrically interconnected to an electrical power supply for the electronic assembly.

* * * * *